(12) United States Patent
Naskar et al.

(10) Patent No.: US 11,791,375 B2
(45) Date of Patent: Oct. 17, 2023

(54) CAPACITOR ARCHITECTURES IN SEMICONDUCTOR DEVICES

(71) Applicant: Intel Corporation, Santa Clara, CA (US)

(72) Inventors: Sudipto Naskar, Portland, OR (US); Manish Chandhok, Beaverton, OR (US); Abhishek A. Sharma, Portland, OR (US); Roman Caudillo, Portland, OR (US); Scott B. Clendenning, Portland, OR (US); Cheyun Lin, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 17/578,839

(22) Filed: Jan. 19, 2022

(65) Prior Publication Data

US 2022/0140069 A1 May 5, 2022

Related U.S. Application Data

(60) Continuation of application No. 17/578,043, filed on Jan. 18, 2022, which is a division of application No. 16/828,497, filed on Mar. 24, 2020, now Pat. No. 11,264,449.

(51) Int. Cl.
*H01L 21/00* (2006.01)
*H01L 49/02* (2006.01)
*H10B 12/00* (2023.01)

(52) U.S. Cl.
CPC .......... *H01L 28/87* (2013.01); *H10B 12/033* (2023.02); *H10B 12/31* (2023.02)

(58) Field of Classification Search
CPC ........ H01L 28/87; H10B 12/033; H10B 12/31
See application file for complete search history.

(56) References Cited

U.S. PATENT DOCUMENTS

| | | | |
|---|---|---|---|
| 6,184,074 B1 * | 2/2001 | Crenshaw | ............... H01L 28/60 257/E21.011 |
| 6,590,762 B2 | 7/2003 | Greenwood | |
| 7,348,870 B2 | 3/2008 | Hsu | |
| 9,524,963 B2 | 12/2016 | Stribley | |
| 10,756,128 B2 | 8/2020 | Lai | |
| 10,998,396 B2 | 5/2021 | Lianfeng | |
| 11,264,449 B2 * | 3/2022 | Naskar | ................. H10B 12/033 |

* cited by examiner

*Primary Examiner* — Richard A Booth

(74) *Attorney, Agent, or Firm* — Schwabe, Williamson & Wyatt, P.C.

(57) ABSTRACT

Embodiments herein describe techniques for a semiconductor device including a three dimensional capacitor. The three dimensional capacitor includes a pole, and one or more capacitor units stacked around the pole. A capacitor unit of the one or more capacitor units includes a first electrode surrounding and coupled to the pole, a dielectric layer surrounding the first electrode, and a second electrode surrounding the dielectric layer. Other embodiments may be described and/or claimed.

20 Claims, 8 Drawing Sheets

CAPACITOR ARCHITECTURES IN SEMICONDUCTOR DEVICES

CROSS-REFERENCE TO RELATED APPLICATIONS

This application is a continuation of U.S. patent application Ser. No. 17/578,043, filed Jan. 18, 2022, which is a division of U.S. patent application Ser. No. 16/828,497, filed on Mar. 24, 2020, the entire contents of which are hereby incorporated by reference herein.

FIELD

Embodiments of the present disclosure generally relate to the field of semiconductor devices, and more particularly, to capacitors in semiconductor devices.

BACKGROUND

Capacitors are important parts of integrated circuits (IC) and semiconductor devices. For example, capacitors may be used as information storage cells in memory devices. A memory device, e.g., a dynamic random access memory (DRAM) array, may include a plurality of memory cells, where a memory cell may include a selector, e.g., a transistor, to control the access to a storage cell, e.g., a capacitor. In addition to memory devices, capacitors may be used in many other applications, such as energy storage devices. In particular, super capacitors (SCs) are gaining ground as energy storage devices due to their high power density, good performance, and long maintenance-free lifetime. Currently, capacitors or super capacitors may be fabricated within the backend interconnect structure, which has limited layout spaces. Therefore, current capacitors may have limited capacity, leading to insufficient power density or information capacity.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example and not by way of limitation in the figures of the accompanying drawings.

DETAILED DESCRIPTION

Front-end-of-line (FEOL) semiconductor processing and structures may refer to a first portion of IC fabrication where individual devices (e.g., transistors, capacitors, resistors, etc.) are patterned in a semiconductor substrate or layer. FEOL generally covers everything up to (but not including) the deposition of metal interconnect layers. A transistor formed in FEOL may also be referred to as a front-end transistor. Following the last FEOL operation, the result is typically a wafer with isolated transistors (e.g., without any wires). Back end of line (BEOL) semiconductor processing and structures may refer to a second portion of IC fabrication where the individual devices (e.g., transistors, capacitors, resistors, etc.) are interconnected with wiring on the wafer, e.g., the metallization layer or layers. BEOL includes metal contacts, dielectrics layers, metal levels, and bonding sites for chip-to-package connections. In the BEOL part of the fabrication, metal contacts, pads, interconnect wires, vias, and dielectric structures may be formed. For modern IC processes, more than 10 metal layers may be added in the BEOL.

Capacitors are important parts of integrated circuits (IC) and semiconductor devices, e.g., to be used as information storage cells in memory devices, or energy storage devices. Capacitors may have different architectures. For example, a metal-insulator-metal (MIM) capacitor includes two metal plates with an insulator between the plates. Currently, MIM capacitors are normally fabricated within the interconnect structure at BEOL, e.g., typically above the metal layer 5 or 7, which has limited spaces. Since the capacitance of a capacitor is linearly proportional to the area of the capacitor, the lack of layout spaces at the BEOL restricts the number of conventional MIM capacitors placed there, leading to insufficient power density when capacitors are used as energy storage devices. Further, being in the BEOL, the fabrication process is restricted by the thermal budget the devices can handle. On the other hand, in pursuit of Moore's low, the modern day processors are becoming increasingly faster and power hungry. For example, with the advent of 5G technology and three dimensional integration stacks for artificial intelligence (AI) and machine learning (ML) processors, the power density will be a major challenge for capacitors when used as energy storage devices. Similar capacity challenges exist when capacitors are used as information storage devices.

Embodiments herein present capacitors that can provide improved power density for the modern day processors or information storage capacity. Capacitors are formed with a corrugated style structure to increase the surface area of the capacitors. Furthermore, in some embodiments, capacitors may integrate a high efficiency solid state electrolyte (SSE) instead of a high-k dielectric to further increase the energy capacity to make it a super capacitor. As a result, embodiments herein may include an electric double layer capacitor (EDLC) based supercapacitor array or Redox faradaic reaction based pseudocapacitor array. The efficacy of the SSE capacitors will enable an electrical double layer across electrode-SSE surface for an EDLC. In case of a pseudo capacitor, the SSE will enable Redox reactions across the same interface. Furthermore, a capacitor array can be vertically integrated into a 3 dimensional interposer or in the backside of the processor. In addition, the capacitor may be connected to the processor directly or indirectly through power rails. As a result, embodiments herein may enable processors to operate at improved frequency while running on battery including the capacitors presented herein. Customers will be able to take advantage of the full processing power of the modern processors remotely without connection to a wired power source.

Embodiments herein present a semiconductor device that includes a three dimensional capacitor. The three dimensional capacitor includes a pole, and one or more capacitor units stacked around the pole. A capacitor unit of the one or more capacitor units includes a first electrode surrounding and coupled to the pole, a dielectric layer surrounding the first electrode, and a second electrode surrounding the dielectric layer.

Embodiments herein present a method for forming a semiconductor device. The method includes forming a transistor, where the transistor includes a channel along a first direction. The method further includes forming a pole placed in a second direction orthogonal to the first direction, forming a first electrode surrounding and coupled to the pole, forming a dielectric layer surrounding the first electrode, and forming a second electrode surrounding the dielectric layer. The first electrode, the dielectric layer, and the second electrode form a capacitor unit around the pole.

Embodiments herein present a computing device, which includes a transistor including a channel along a first direction located in a semiconductor device, and a three dimensional capacitor coupled to the transistor. The three dimensional capacitor includes a pole placed in a second direction orthogonal to the first direction, and one or more capacitor units stacked around the pole. A capacitor unit of the one or more capacitor units includes a first electrode surrounding and coupled to the pole, a dielectric layer surrounding the first electrode, and a second electrode surrounding the dielectric layer.

In the following description, various aspects of the illustrative implementations will be described using terms commonly employed by those skilled in the art to convey the substance of their work to others skilled in the art. However, it will be apparent to those skilled in the art that the present disclosure may be practiced with only some of the described aspects. For purposes of explanation, specific numbers, materials and configurations are set forth in order to provide a thorough understanding of the illustrative implementations. However, it will be apparent to one skilled in the art that the present disclosure may be practiced without the specific details. In other instances, well-known features are omitted or simplified in order not to obscure the illustrative implementations.

Various operations will be described as multiple discrete operations, in turn, in a manner that is most helpful in understanding the present disclosure. However, the order of description should not be construed to imply that these operations are necessarily order dependent. In particular, these operations may not be performed in the order of presentation. For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

The terms "over," "under," "between," "above," and "on" as used herein may refer to a relative position of one material layer or component with respect to other layers or components. For example, one layer disposed over or under another layer may be directly in contact with the other layer or may have one or more intervening layers. Moreover, one layer disposed between two layers may be directly in contact with the two layers or may have one or more intervening layers. In contrast, a first layer "on" a second layer is in direct contact with that second layer. Similarly, unless explicitly stated otherwise, one feature disposed between two features may be in direct contact with the adjacent features or may have one or more intervening features.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. The term "directly coupled" may mean that two or more elements are in direct contact.

In various embodiments, the phrase "a first feature formed, deposited, or otherwise disposed on a second feature" may mean that the first feature is formed, deposited, or disposed over the second feature, and at least a part of the first feature may be in direct contact (e.g., direct physical and/or electrical contact) or indirect contact (e.g., having one or more other features between the first feature and the second feature) with at least a part of the second feature.

Where the disclosure recites "a" or "a first" element or the equivalent thereof, such disclosure includes one or more such elements, neither requiring nor excluding two or more such elements. Further, ordinal indicators (e.g., first, second, or third) for identified elements are used to distinguish between the elements, and do not indicate or imply a required or limited number of such elements, nor do they indicate a particular position or order of such elements unless otherwise specifically stated.

As used herein, the term "circuitry" may refer to, be part of, or include an Application Specific Integrated Circuit (ASIC), an electronic circuit, a processor (shared, dedicated, or group), and/or memory (shared, dedicated, or group) that execute one or more software or firmware programs, a combinational logic circuit, and/or other suitable hardware components that provide the described functionality. As used herein, "computer-implemented method" may refer to any method executed by one or more processors, a computer system having one or more processors, a mobile device such as a smartphone (which may include one or more processors), a tablet, a laptop computer, a set-top box, a gaming console, and so forth.

Implementations of the disclosure may be formed or carried out on a substrate, such as a semiconductor substrate. In one implementation, the semiconductor substrate may be a crystalline substrate formed using a bulk silicon or a silicon-on-insulator substructure. In other implementations, the semiconductor substrate may be formed using alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-V or group IV materials. Although a few examples of materials from which the substrate may be formed are described here, any material that may serve as a foundation upon which a semiconductor device may be built falls within the spirit and scope of the present disclosure.

A plurality of transistors, such as metal-oxide-semiconductor field-effect transistors (MOSFET or simply MOS transistors), may be fabricated on the substrate. In various implementations of the disclosure, the MOS transistors may be planar transistors, nonplanar transistors, or a combination of both. Nonplanar transistors include FinFET transistors such as double-gate transistors and tri-gate transistors, and wrap-around or all-around gate transistors such as nanoribbon and nanowire transistors. Although the implementations described herein may illustrate only planar transistors, it should be noted that the disclosure may also be carried out using nonplanar transistors.

Each MOS transistor includes a gate stack formed of at least two layers, a gate dielectric layer and a gate electrode layer. The gate dielectric layer may include one layer or a stack of layers. The one or more layers may include silicon oxide, silicon dioxide ($SiO_2$) and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric layer include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric layer to improve its quality when a high-k material is used.

The gate electrode layer is formed on the gate dielectric layer and may consist of at least one P-type work function metal or N-type work function metal, depending on whether the transistor is to be a PMOS or an NMOS transistor. In some implementations, the gate electrode layer may consist of a stack of two or more metal layers, where one or more metal layers are work function metal layers and at least one metal layer is a fill metal layer. Further metal layers may be included for other purposes, such as a barrier layer.

For a PMOS transistor, metals that may be used for the gate electrode include, but are not limited to, ruthenium, palladium, platinum, cobalt, nickel, and conductive metal oxides, e.g., ruthenium oxide. A P-type metal layer will enable the formation of a PMOS gate electrode with a work function that is between about 4.9 eV and about 5.2 eV. For an NMOS transistor, metals that may be used for the gate electrode include, but are not limited to, hafnium, zirconium, titanium, tantalum, aluminum, alloys of these metals, and carbides of these metals such as hafnium carbide, zirconium carbide, titanium carbide, tantalum carbide, and aluminum carbide. An N-type metal layer will enable the formation of an NMOS gate electrode with a work function that is between about 3.9 eV and about 4.2 eV.

In some implementations, when viewed as a cross-section of the transistor along the source-channel-drain direction, the gate electrode may consist of a "U"-shaped structure that includes a bottom portion substantially parallel to the surface of the substrate and two sidewall portions that are substantially perpendicular to the top surface of the substrate. In another implementation, at least one of the metal layers that form the gate electrode may simply be a planar layer that is substantially parallel to the top surface of the substrate and does not include sidewall portions substantially perpendicular to the top surface of the substrate. In further implementations of the disclosure, the gate electrode may consist of a combination of U-shaped structures and planar, non-U-shaped structures. For example, the gate electrode may consist of one or more U-shaped metal layers formed atop one or more planar, non-U-shaped layers.

In some implementations of the disclosure, a pair of sidewall spacers may be formed on opposing sides of the gate stack that bracket the gate stack. The sidewall spacers may be formed from a material such as silicon nitride, silicon oxide, silicon carbide, silicon nitride doped with carbon, and silicon oxynitride. Processes for forming sidewall spacers are well known in the art and generally include deposition and etching process operations. In an alternate implementation, a plurality of spacer pairs may be used, for instance, two pairs, three pairs, or four pairs of sidewall spacers may be formed on opposing sides of the gate stack.

As is well known in the art, source and drain regions are formed within the substrate adjacent to the gate stack of each MOS transistor. The source and drain regions are generally formed using either an implantation/diffusion process or an etching/deposition process. In the former process, dopants such as boron, aluminum, antimony, phosphorous, or arsenic may be ion-implanted into the substrate to form the source and drain regions. An annealing process that activates the dopants and causes them to diffuse further into the substrate typically follows the ion implantation process. In the latter process, the substrate may first be etched to form recesses at the locations of the source and drain regions. An epitaxial deposition process may then be carried out to fill the recesses with material that is used to fabricate the source and drain regions. In some implementations, the source and drain regions may be fabricated using a silicon alloy such as silicon germanium or silicon carbide. In some implementations the epitaxially deposited silicon alloy may be doped in situ with dopants such as boron, arsenic, or phosphorous. In further embodiments, the source and drain regions may be formed using one or more alternate semiconductor materials such as germanium or a group III-V material or alloy. And in further embodiments, one or more layers of metal and/or metal alloys may be used to form the source and drain regions.

One or more interlayer dielectrics (ILD) are deposited over the MOS transistors. The ILD layers may be formed using dielectric materials known for their applicability in integrated circuit structures, such as low-k dielectric materials. Examples of dielectric materials that may be used include, but are not limited to, silicon dioxide ($SiO_2$), carbon doped oxide (CDO), silicon nitride, organic polymers such as perfluorocyclobutane or polytetrafluoroethylene, fluorosilicate glass (FSG), and organosilicates such as silsesquioxane, siloxane, or organosilicate glass. The ILD layers may include pores or air gaps to further reduce their dielectric constant.

Figure 1A:
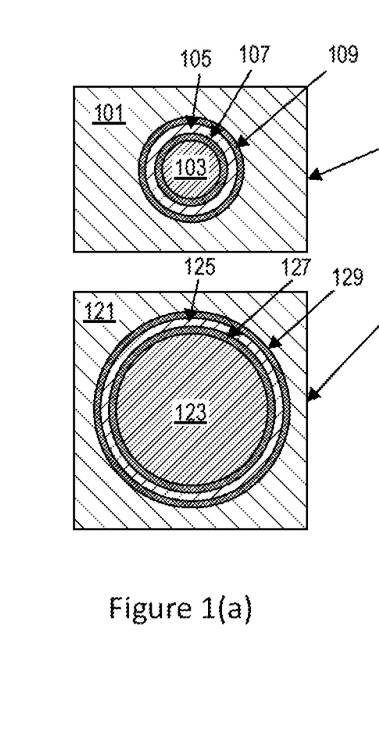
FIGS. 1(a)-1(e) schematically illustrate diagrams of a semiconductor device including a three dimensional capacitor having one or more capacitor units stacked around a pole, in accordance with some embodiments.
Figure 1B:
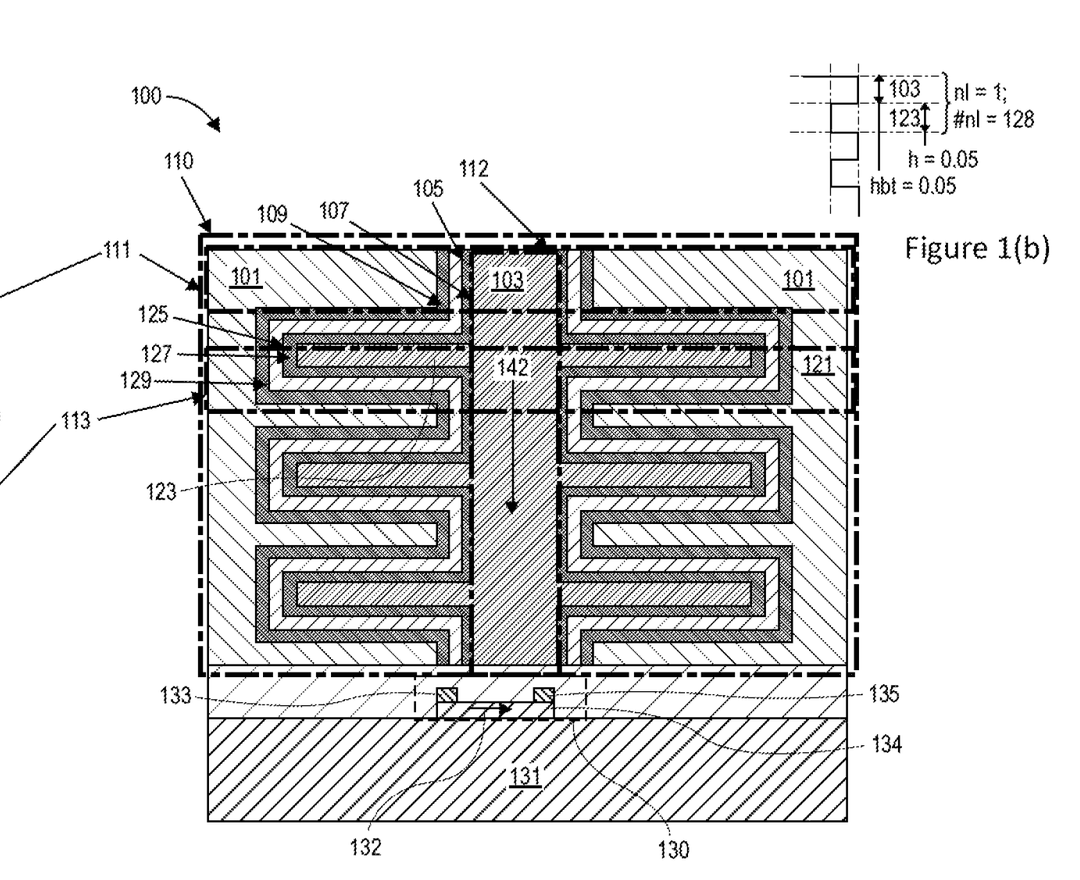
Figure 1C:
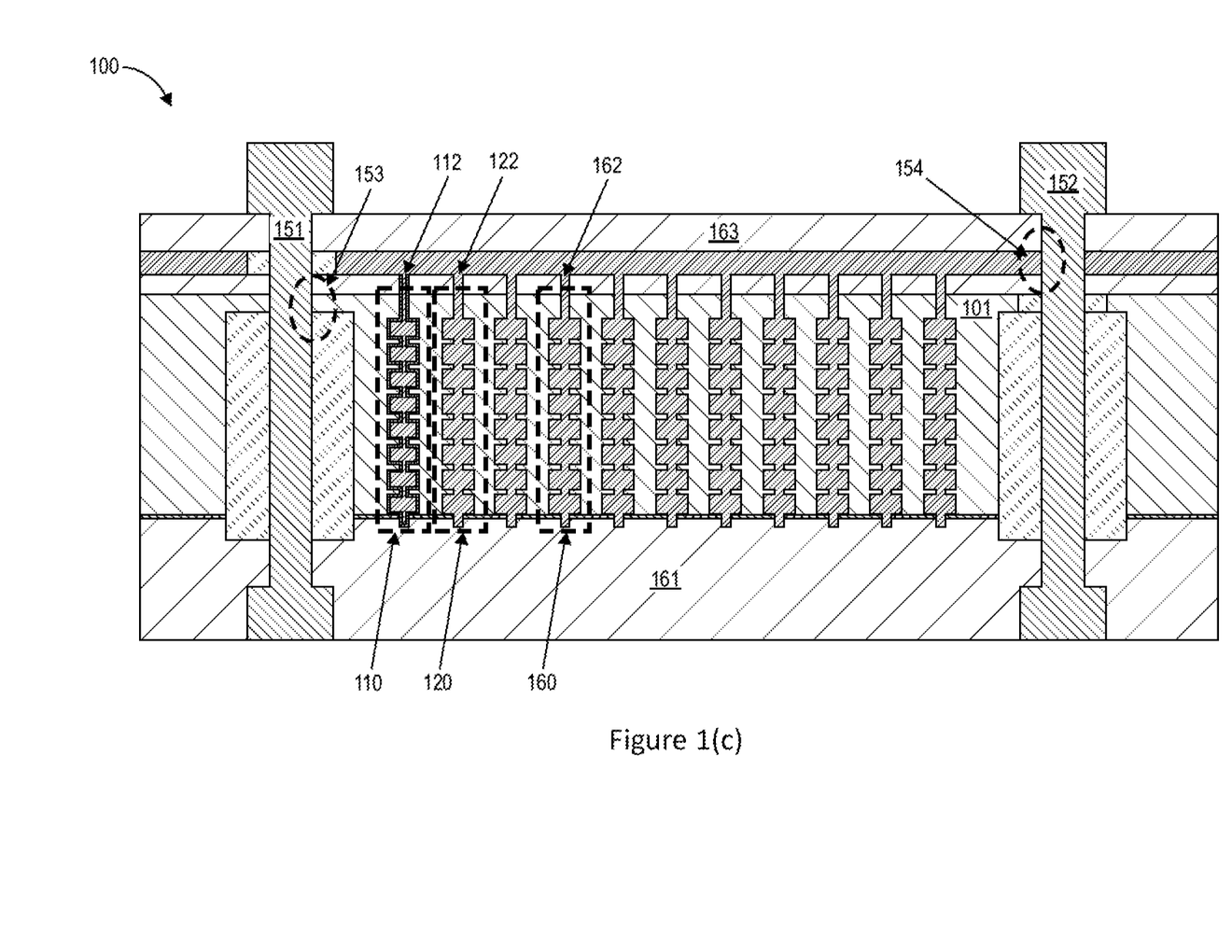
Figure 1D:
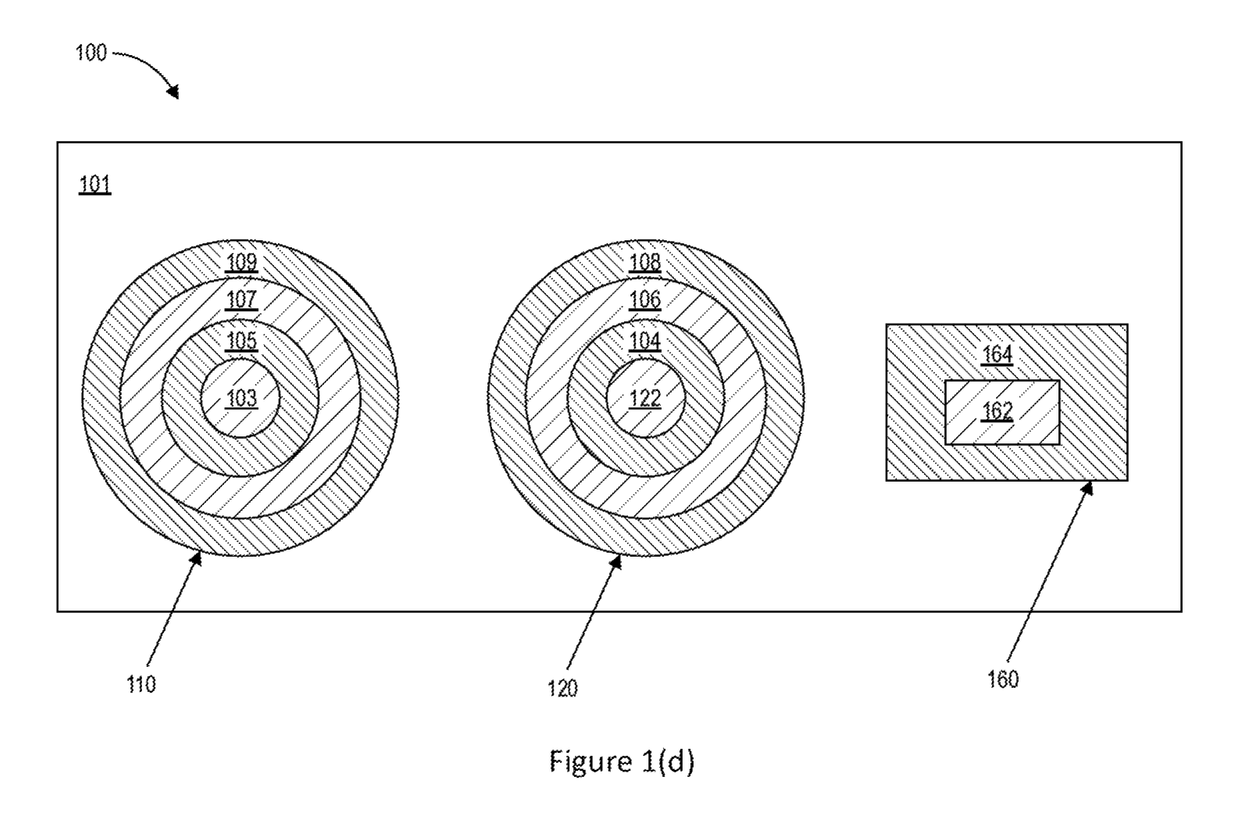
Figure 1E:
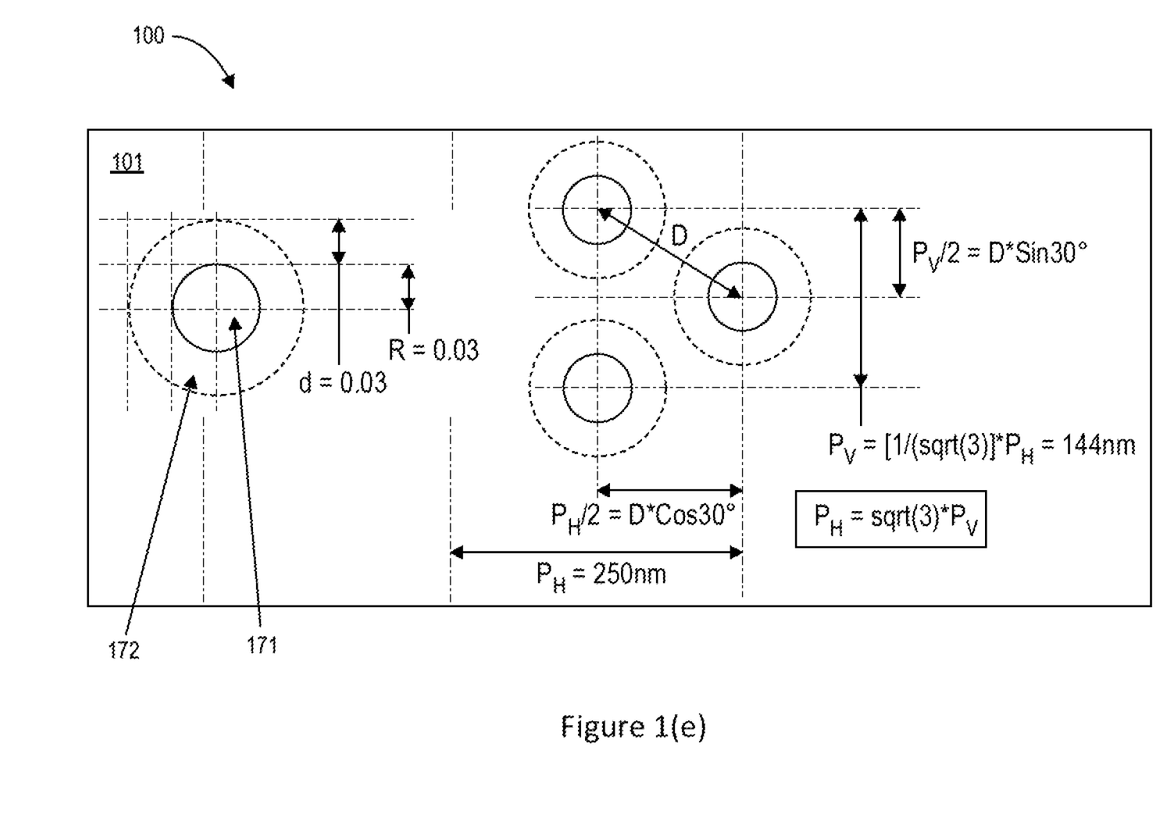

FIGS. 1(a)-1(e) schematically illustrate diagrams of a semiconductor device 100 including a three dimensional capacitor having one or more capacitor units stacked around a pole, in accordance with some embodiments. FIGS. 1(a)-1(b) show the device 100 and a capacitor 110 in a cross section view and top down view. FIG. 1(c) shows the device 100 to include an array of three dimensional capacitors in a cross section view. FIGS. 1(d) and 1(e) show the device 100 and an array of three dimensional capacitors in top down view. A three dimensional capacitor may be simply referred to as a capacitor.

In embodiments, as shown in FIG. 1(a), the semiconductor device 100 includes a substrate 131, and a transistor 130 formed within the substrate 131 or above the substrate 131. The capacitor 110 may be formed further above the transistor 130. In some embodiments, the transistor 130 may be a FEOL transistor, e.g., a transistor of a processor formed within the substrate 131. In some other embodiments, the transistor 130 may be a BEOL transistor, e.g., a thin-filmtransistor (TFT), which may be a part of a memory device. The transistor 130 includes a channel 134, a source electrode 133, and a drain electrode 135. The channel 134 may be along a horizontal direction 132 from the source electrode 133 to the drain electrode 135 through the channel 134. The capacitor 110 may be an information storage cell controlled by the transistor 130, or an energy storage device to supply power to the transistor 130.

In embodiments, the capacitor 110 includes a pole 112, and one or more capacitor units, e.g., a capacitor unit 111, a capacitor unit 113, and more, stacked around the pole 112, where the pole 112 is placed in a second direction 142 orthogonal to the first direction 132. The pole 112 may include various materials, e.g., a conductive material, a dielectric material, an insulator, or other materials. As shown in FIG. 1(b), the capacitor unit 111 and the capacitor unit 113 may form one pair, and the capacitor 110 may include 128 pairs of such capacitor units. FIG. 1(b) is shown only as an example. There may be other number of capacitor units stacked around the pole.

A capacitor unit, e.g., the capacitor unit 111, may include a first electrode 103 surrounding and coupled to the pole 112, a dielectric layer 105 surrounding the first electrode 103, and a second electrode 101 surrounding the dielectric layer 105. In some embodiments, the capacitor unit 111 may further include an interface layer 107 between the first electrode 103 and the dielectric layer 105, or an interface layer 109 between the dielectric layer 105 and the second electrode 101. The interface layer 107 or the interface layer 109 is optional and may not be included in all capacitor units. The capacitor unit 113 also includes a first electrode 123 surrounding and coupled to the pole 112, a dielectric layer 125 surrounding the first electrode 123, and a second electrode 121 surrounding the dielectric layer 125. The capacitor unit 113 may further include an interface layer 127 between the first electrode 123 and the dielectric layer 125, or an interface layer 129 between the dielectric layer 125 and the second electrode 121. In some embodiments, as shown in FIG. 1(b), a height of the capacitor unit 111, e.g., a height of the first electrode 103 may be around 0.05 um, while a height of the first electrode 123 may be around 0.05 um as well.

In some embodiments, a capacitor unit, e.g., the capacitor unit 111, may have the pole 112 to act as the first electrode 103. In some other embodiments, the first electrode may be an additional component surrounding the pole. For example, for the capacitor unit 113, to have a larger area, the first electrode 123 is a component coupled to the pole 112 and extended into the direction 132 orthogonal to the pole 112.

In some embodiments, the capacitor unit 111 and the capacitor unit 113 may share the dielectric layer, the interface layers, or electrodes. As shown in FIG. 1(a), the dielectric layer 105 of the capacitor unit 111 and the dielectric layer 125 of the capacitor unit 113 form a continuous dielectric layer conformally surrounding the pole 112 and the first electrode 103 of the capacitor unit 111 and the first electrode 123 of the capacitor unit 113. Similarly, the interface layer 107 and the interface layer 109 of the capacitor unit 111, and the interface layer 127 and the interface layer 129 of the capacitor unit 113, also form a continuous interface layers conformally surrounding the pole 112. The second electrode 101 of the capacitor unit 111 and the second electrode 121 of the capacitor unit 113 form a continuous electrode conformally surrounding the pole 112 and the continuous dielectric layer. For example, the second electrode 101 and the second electrode 121 may be one piece continuous conductive metal formed at the same time.

In some other embodiments, the first electrode 103 of the capacitor unit 111 contains a material different from the first electrode 123 of the capacitor unit 113, the dielectric layer 105 of the capacitor unit 111 contains a material different from the dielectric layer 125 of the capacitor unit 113, or a second electrode 101 of the capacitor unit 111 contains a material different from a second electrode 121 of the capacitor unit 113. Similarly, the interface layer 107 or the interface layer 109 of the capacitor unit 111 may contain a material different from materials in the interface layer 127 or the interface layer 129 of the capacitor unit 113.

In embodiments, the first electrode 103 of the capacitor unit 111 or the first electrode 123 of the capacitor unit 113, the dielectric layer 105 of the capacitor unit 111 or the dielectric layer 125 of the capacitor unit 113, or the second electrode 101 of the capacitor unit 111 or the second electrode 121 of the capacitor unit 113 may enclose an area of a square shape, a rectangular shape, a circle, an ellipse shape, a polygon comprising three or more sides, or any other irregular shape. FIG. 1(a) shows the first electrode 103, the first electrode 123, the dielectric layer 105, the dielectric layer 125 encloses a circle, while the second electrode 101 and the second electrode 121 encloses a square. Other shapes are possible for other embodiments. In some embodiments, the first electrode, the second electrode, the dielectric layer, and the interface layers may enclose different shapes.

In embodiments, the first electrode 103 of the capacitor unit 111 has a first circumference in a top down view and a first area, and the first electrode 123 of the capacitor unit 113 has a second circumference in a top down view and a second area. The first circumference may be different from the second circumference, or the first area may be different from the second area. Similarly, the second electrode, the dielectric layer, or the interface layers of different capacitor units may have different circumferences or areas.

In embodiments, the first electrode, e.g., the first electrode 103 of the capacitor unit 111, or the first electrode 123 of the capacitor unit 113, may include a first metallic material with a first work function, and the second electrode, e.g., the second electrode 101 of the capacitor unit 111, or the second electrode 121 of the capacitor unit 113, may include a second metallic material with a second work function different from the first work function. The first electrode 103, the first electrode 123, the second electrode 101, or the second electrode 121, may include W, Mo, Ti, Ta, Al, TaN, TiN, TiC, WN, MoN, MoC, Co, Ni, Cu, Ru, Pd, Pt, Ir, IrOx, graphene, $MnO_2$, Li, RuOx, ITO, SrRuOx, a metal oxide, graphitic carbon, an alkali metal, a low-work-function metal, a transition metal oxide, a Co oxide, $LiCoO2$, $NaCoO2$, a transition metal dichalcogenide, a spinel oxide, $LiMn_2O_4$, $LiNiMnO_4$, a conducting polymer, or a conductive metal.

In embodiments, the dielectric layer 105 or the dielectric layer 125 may include $Al_2O_3$, $HfO_2$, $ZrO_2$, $TiO_2$, $Nb_2O_5$, $Ta_2O_5$, $SrTiO_x$, $BaTiO_x$, $Ga_2O_3$, $Y_2O_3$, a rare earth oxide, a solid-state electrolyte, a glass electrolyte, a ceramic electrolyte, an ionically-conducting antiperovskite, $Li_3ClO$, a doped $Li_{(3-2x)}D_xClO$ where D is a divalent cation dopant, hafnium silicate, zirconium silicate, hafnium dioxide, hafnium zirconate, zirconium dioxide, aluminum oxide, titanium oxide, silicon nitride, carbon doped silicon nitride, silicon carbide, and nitride hafnium silicate, a high-k dielectric material, or an alloy thereof. When the dielectric layer 105 or the dielectric layer 125 includes a solid state electrolyte layer, the solid state electrolyte layer may include oxide, or a chalcogenide based layer.

In embodiments, the interface layer 107, the interface layer 109, the interface layer 127, the interface layer 129, may include a pseudocapacitive layer, and the pseudocapacitive layer includes $RuO_x$, $MnO_x$, $VO_x$, an active redox center material, or a catalytic relay material. For example, the dielectric layer 105 may be a solid-state electrolyte, and the interface layer 107 or the interface layer 109 may be a pseudocapacitive layer in contact with the dielectric layer and an electrode. The pseudocapacitive layer includes material with the active redox couple where the faradaic reaction will take place. The pseudocapacitive layer is in contact with an electrode and an electrolyte in order for the pseudocapacitor to function as an electrochemical energy storage device. In practice, pseudocapacitors store energy both electrostatically in an electric double layer and electrochemically through Faradaic reactions.

In embodiments, the capacitor 110 may be a normal capacitor to store information, a supercapacitor, an electrostatic double-layer capacitor (EDLC), an electrochemical capacitor, a pseudocapacitor, a redox faradaic reaction based pseudocapacitor, a lithium-ion capacitor, an electrochemical energy storage device, or a hybrid battery-supercapacitor device. The capacitor 110 may have a dielectric breakdown voltage of greater than about 1V and less than about 5V.

In embodiments, when the capacitor 110 is a normal capacitor, the dielectric layer 105 or the dielectric layer 125 may not be ionically conducting, i.e. not a solid-state electrolyte, but a high-k dielectric material. When the capacitor 110 is a supercapacitor, the dielectric layer 105 or the dielectric layer 125 may be a solid-state electrolyte, but without a pseudocapactive layer as an interface layer. In such a case, the capacitor 110 stores energy electrostatically, primarily in an electric double layer at each electrode-electrolyte interface. When the capacitor 110 functions primarily as a pseudocapacitor, the dielectric layer 105 or the dielectric layer 125 is a solid-state electrolyte, and a pseudocapactive layer is present and in contact with both the electrode and the solid-state electrolyte. In such a case, the capacitor 110 stores energy both electrostatically in an electric double layer and electrochemically through Faradaic reactions at each electrode-pseudocapactive layer-electrolyte interface. In some embodiments, a supercapacitor may further include a separated thin layer at the center of the electrolyte layer that acts as a separator.

FIG. 1(c) shows the device 100 includes an array of three dimensional capacitors, a capacitor 110, a capacitor 120, a capacitor 160, and more, in a cross section view. As described above for FIG. 1(a), the capacitor 110 includes a pole 112, and one or more capacitor units, e.g., the capacitor unit 111, the capacitor unit 113, and more, stacked around the pole 112. In embodiments, the pole 112 includes a conductive material, and functions as a first electrode for the capacitor 110. On the other hand, the capacitor units of the capacitor 110 share a same second electrode 101. Similarly, the capacitor 120 includes a pole 122, and one or more capacitor units stacked around the pole 122. In embodiments, the pole 122 includes a conductive material, and functions as a first electrode for the capacitor 120. On the other hand, the capacitor units of the capacitor 120 share a same second electrode 101, which is shared with the capacitor 110. Similarly, the capacitor 160 includes a pole 162, and one or more capacitor units stacked around the pole 162. In embodiments, the pole 162 includes a conductive material, and functions as a first electrode for the capacitor 160. On the other hand, the capacitor units of the capacitor 160 share a same second electrode 101, which is shared with the capacitor 110 and the capacitor 120.

The pole 112, the pole 122, and the pole 162 are coupled to a shared electrode 152 at a location 154, while the shared second electrode 101 is coupled to a shared electrode 151 at a location 153. The shared electrode 151 or the shared electrode 152 may be coupled to a bus or a power rail. The capacitor 110, the capacitor 120, the capacitor 160, and more, form a capacitor array embedded within a dielectric layer 161 and a dielectric layer 163.

FIG. 1(d) shows the device 100 with the capacitor 110, the capacitor 120, the capacitor 160 in top down view, which is the same device 100 as shown in FIGS. 1(a)-1(c). A capacitor unit, e.g., the capacitor unit 111, of the capacitor 110 includes the first electrode 103 surrounding and coupled to the pole 112, the dielectric layer 105 surrounding the first electrode 103, and the second electrode 101 surrounding the dielectric layer 105, the interface layer 107 between the first electrode 103 and the dielectric layer 105, and the interface layer 109 between the dielectric layer 105 and the second electrode 101. The first electrode 103, the dielectric layer 105, the interface layer 107, the interface layer 109, encloses an area of a circle shape. The second electrode 101 encloses an area of a square shape.

Similarly, a capacitor unit of the capacitor 120 includes a first electrode which is coupled to the pole 122, a dielectric layer 106 surrounding the first electrode 122, and the second electrode 101 surrounding the dielectric layer 106, an interface layer 104 between the first electrode 122 and the dielectric layer 106, and an interface layer 108 between the dielectric layer 106 and the second electrode 101. The first electrode 122, the dielectric layer 106, the interface layer 104, the interface layer 108, encloses an area of a circle shape.

In addition, a capacitor unit of the capacitor 160 includes a first electrode which is coupled to the pole 162, a dielectric layer 164 surrounding the first electrode 102, and the second electrode 101 surrounding the dielectric layer 164. The first electrode 162, or the dielectric layer 164 encloses an area of a square shape.

FIG. 1(e) shows the device 100 including an array of capacitors with various sizes as examples. Even though a capacitor may have multiple layers, e.g., 3 layers or 5 layers of first electrode, dielectric layer, and interface layers, only two such layers, a layer 171 and a layer 172 are shown as examples for calculation. The layer 171 may be a first electrode, and the layer 172 may be a dielectric layer. A capacitor may have multiple stacks, (#n1). For each bilayer in the stack (#n1), total surface area (SALH)=(2*pi*R*hbt+ 2*pi*(R+d)*h+2*pi*((R+d)^2−R^2)), where hbt and h are shown in FIG. 1(b). Total surface area per hole=SALH*#nl. Bitcell top down area (BCA)=$P_V$*$P_H$. # of Bitcells/unit area=1/BCA. Total 'Hole' surface area per unit 'Top down' area=(1/BCA)*SALH*#nl.

Figure 2:
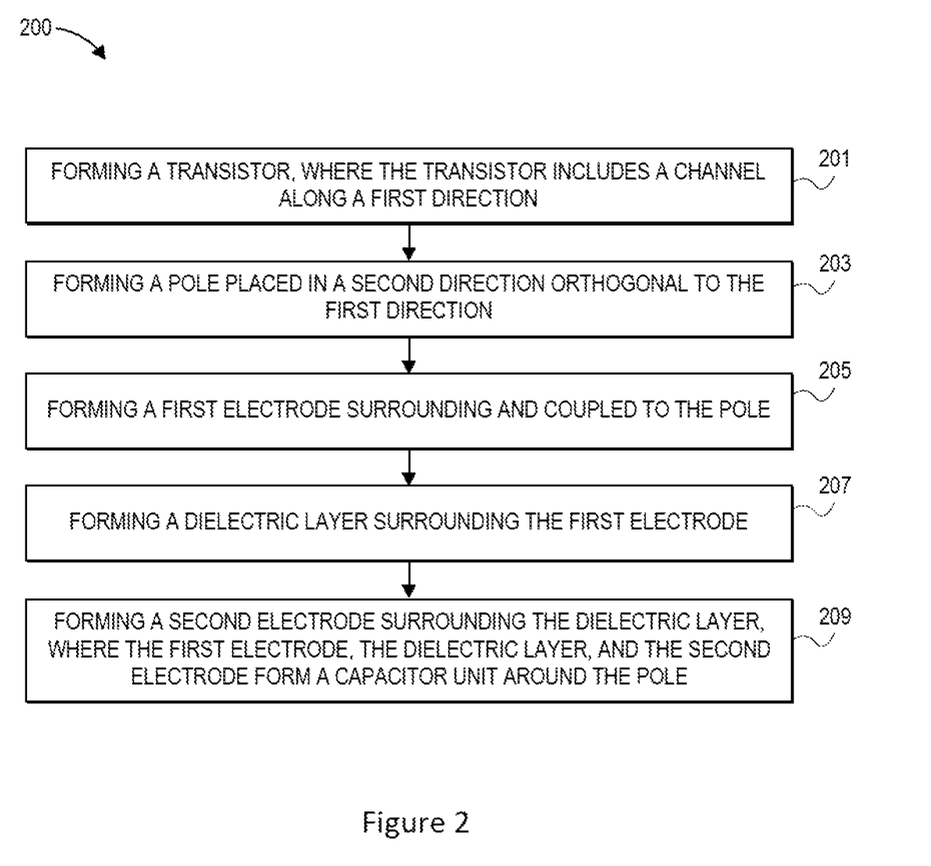
FIG. 2 illustrates a process for forming a semiconductor device including a three dimensional capacitor having one or more capacitor units stacked around a pole, in accordance with some embodiments.

FIG. 2 illustrates a process 200 for forming a semiconductor device including a three dimensional capacitor having one or more capacitor units stacked around a pole, in accordance with some embodiments. In embodiments, the process 200 may be applied to form the semiconductor device 100 including the capacitor 110 having the capacitor unit 113 stacked around a pole, as shown in FIG. 1(a).

At block 201, the process 200 includes forming a transistor, where the transistor includes a channel along a first direction. For example, the process 200 may include the transistor 130, where the transistor 130 includes the channel 134 along the horizontal direction, as shown in FIG. 1(a).

At block 203, the process 200 includes forming a pole placed in a second direction orthogonal to the first direction. For example, the process 200 includes forming the pole 112 placed in the vertical direction orthogonal to the horizontal direction, as shown in FIG. 1(a).

At block 205, the process 200 includes forming a first electrode surrounding and coupled to the pole. For example, the process 200 includes forming the first electrode 123 surrounding and coupled to the pole 112, as shown in FIG. 1(a).

At block 207, the process 200 includes forming a dielectric layer surrounding the first electrode. For example, the process 200 includes forming the dielectric layer 125 surrounding the first electrode 123, as shown in FIG. 1(a).

At block 209, the process 200 includes forming a second electrode surrounding the dielectric layer, where the first electrode, the dielectric layer, and the second electrode form a capacitor unit around the pole. For example, the process 200 includes forming the second electrode 121 surrounding the dielectric layer 125, where the first electrode 123, the dielectric layer 125, and the second electrode 121 form the capacitor unit 113 around the pole 112.

In addition, the process 200 may include additional operations. For example, the process 200 includes forming another capacitor unit above the capacitor unit formed in the blocks 201-209. In detail, forming the second capacitor unit includes forming a first electrode of the second capacitor unit surrounding and coupled to the pole and above the first capacitor unit, forming a dielectric layer of the second capacitor unit surrounding the first electrode of the second capacitor, and forming a second electrode of the second capacitor unit surrounding the dielectric layer of the second capacitor. In some embodiments, the dielectric layer of the first capacitor unit and the dielectric layer of the second capacitor unit form a continuous dielectric layer conformally surrounding the pole and the first electrodes of the first capacitor unit and the second capacitor unit, and the second electrode of the first capacitor and the second electrode of the second capacitor form a continuous electrode. In addition, the process 200 may further include forming an interface layer between the first electrode and the dielectric layer, or between the dielectric layer and the second electrode.

Figure 3A:
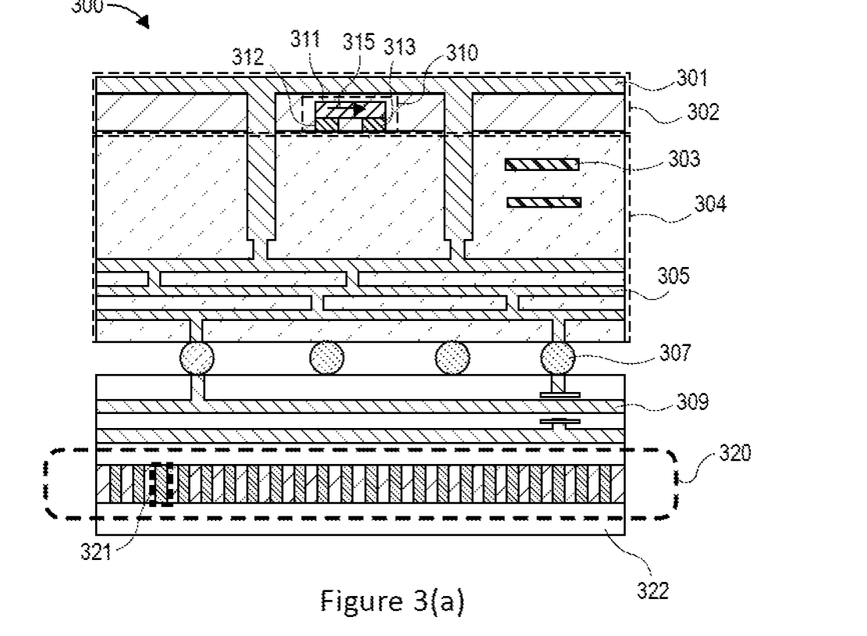
FIGS. 3(a)-3(b) schematically illustrate diagrams of semiconductor devices including a three dimensional capacitor having one or more capacitor units stacked around a pole, in accordance with some embodiments.
Figure 3B:
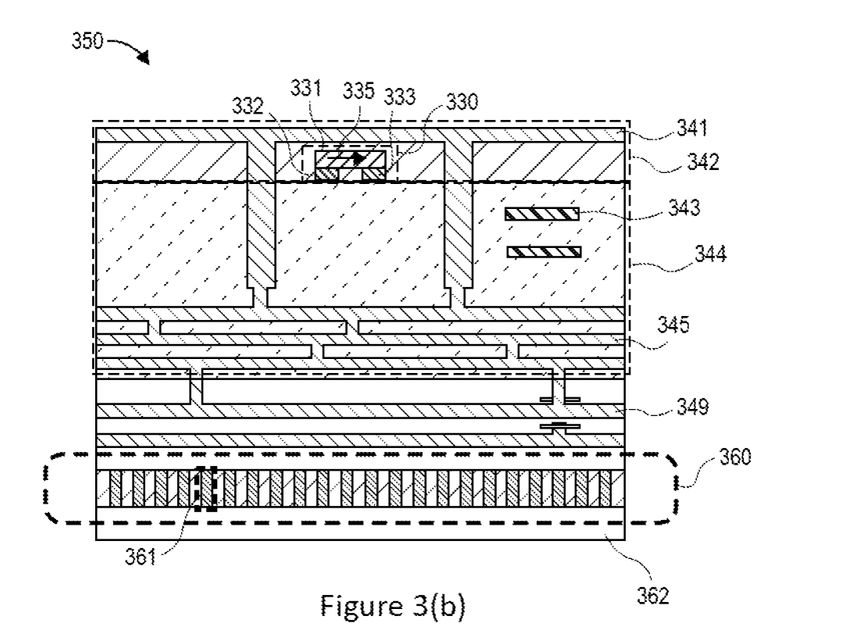

FIGS. 3(a)-3(b) schematically illustrate diagrams of semiconductor devices including a three dimensional capacitor having one or more capacitor units stacked around a pole, in accordance with some embodiments. FIG. 3(a) shows a semiconductor device 300 including a capacitor 321 having one or more capacitor units stacked around a pole. In embodiments, the capacitor 321 may be a portion of a capacitor array 320. FIG. 3(b) shows a semiconductor device 350 including a capacitor 361 having one or more capacitor units stacked around a pole. In embodiments, the capacitor 361 may be a portion of a capacitor array 360. The capacitor 321 and the capacitor 361 may be similar to the capacitor 110 as shown in FIG. 1(a).

In embodiments, as shown in FIG. 3(a), the device 300 includes a substrate 301, a transistor 310 formed at the FEOL 302. In some embodiments, the transistor 310 may be a transistor of a processor. The transistor 310 includes a channel 311, a source electrode 312, and a drain electrode 313. The channel 311 may be in a horizontal direction 315 from the source electrode 312 to the drain electrode 313 through the channel 311. An interconnect structure 303 is formed in BEOL 304 of the device 300. A power rail 305 is coupled to the transistor 310, where the power rail 305 is located at the BEOL 304.

In embodiments, the capacitor array 320 is formed above or within a substrate 322, where the substrate 322 is different from the substrate 301. Instead, the substrate 322 is coupled to the device 300 at the backside through one or more connectors 307. The capacitor array 320 includes the capacitor 321, where the first electrode or the second electrode of the capacitor 321 is coupled to a power rail 309. The power rail 309 is coupled to the power rail 305 through one or more connectors 307. In some embodiments, the connectors 307 may be a solder ball, a micro ball, or any other connectors. The capacitor 321 is coupled to the transistor 310 through the power rail 305 located at BEOL 304 for the device 300, the connector 307, and the power rail 309.

In embodiments, as shown in FIG. 3(b), the device 350 includes a substrate 341, a transistor 330 formed at the FEOL 342. In some embodiments, the transistor 330 may be a transistor of a processor. The transistor 330 includes a channel 331, a source electrode 332, and a drain electrode 333. The channel 331 may be in a horizontal direction 335 from the source electrode 332 to the drain electrode 333 through the channel 331. An interconnect structure 343 is formed in BEOL 344 of the device 350. A power rail 345 is coupled to the transistor 330, where the power rail 345 is located at the BEOL 344.

In embodiments, the capacitor array 360 is formed above or within a substrate 362, where the substrate 362 is different from the substrate 341. Instead, the substrate 362 is directly coupled to the device 300 at the backside, e.g., by direct bonding. The capacitor array 360 includes the capacitor 361, where the first electrode or the second electrode of the capacitor 361 is coupled to a power rail 349. The power rail 349 is coupled to the power rail 345 without going through a connector. The capacitor 361 is coupled to the transistor 330 through the power rail 345 located at BEOL 344 for the device 300 and the power rail 349.

Figure 4:
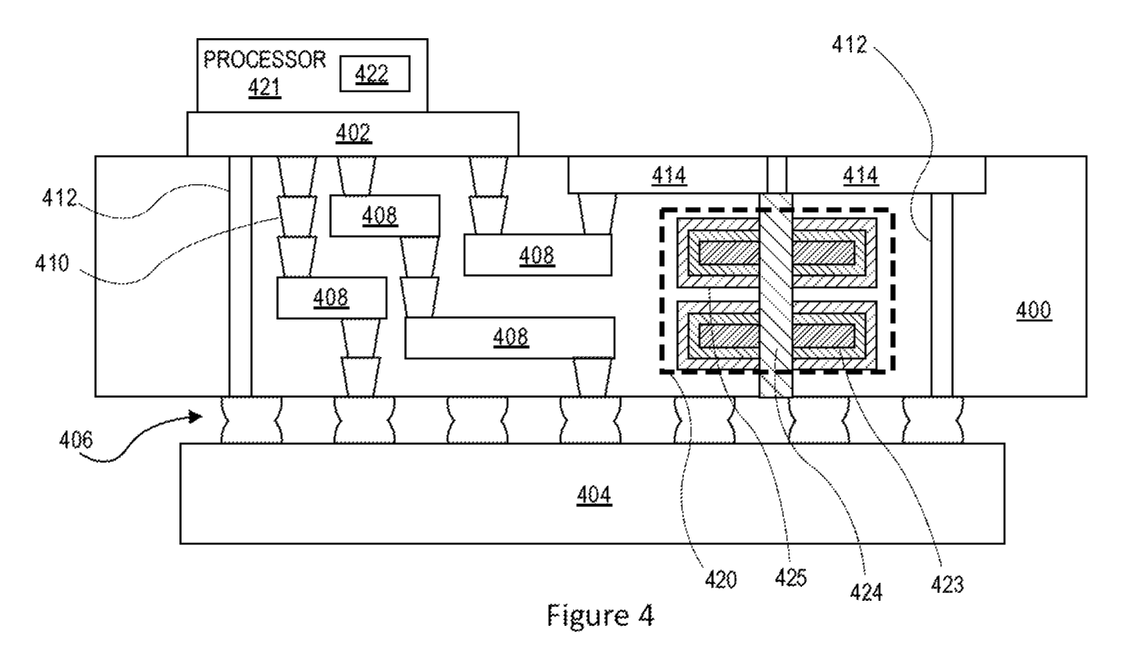
FIG. 4 schematically illustrates an interposer implementing one or more embodiments of the disclosure, in accordance with some embodiments.

FIG. 4 illustrates an interposer 400 that includes one or more embodiments of the disclosure. The interposer 400 is an intervening substrate used to bridge a first substrate 402 to a second substrate 404. The first substrate 402 may be, for instance, a substrate support for a device, e.g., a processor 421 including a transistor 422. The transistor 422 may have a channel along a horizontal direction. The second substrate 404 may be, for instance, a computer motherboard, a circuit board, or another integrated circuit die. Generally, the purpose of an interposer 400 is to spread a connection to a wider pitch or to reroute a connection to a different connection. For example, an interposer 400 may couple an integrated circuit die to a ball grid array (BGA) 406 that can subsequently be coupled to the second substrate 404. In some embodiments, the first and second substrates 402/404 are attached to opposing sides of the interposer 400. In other embodiments, the first and second substrates 402/404 are attached to the same side of the interposer 400. And in further embodiments, three or more substrates are interconnected by way of the interposer 400.

In embodiments, the interposer 400 includes a capacitor 420, where the capacitor 420 is coupled to the processor 421 through metal interconnects 408, vias 410, or through-silicon vias (TSVs) 412. In embodiments, the capacitor 420 includes a pole 424, and one or more capacitor units, e.g., a capacitor unit 423, a capacitor unit 425, and more, stacked around the pole 424, where the pole 424 is placed in a vertical direction.

The interposer 400 may be formed of an epoxy resin, a fiberglass-reinforced epoxy resin, a ceramic material, or a polymer material such as polyimide. In further implementations, the interposer 400 may be formed of alternate rigid or flexible materials that may include the same materials described above for use in a semiconductor substrate, such as silicon, germanium, and other group III-V and group IV materials.

The interposer 400 may include metal interconnects 408 and vias 410, including but not limited to through-silicon vias (TSVs) 412. The interposer 400 may further include embedded devices 414, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 400.

In accordance with embodiments of the disclosure, apparatuses or processes disclosed herein may be used in the fabrication of interposer 400.

Figure 5:
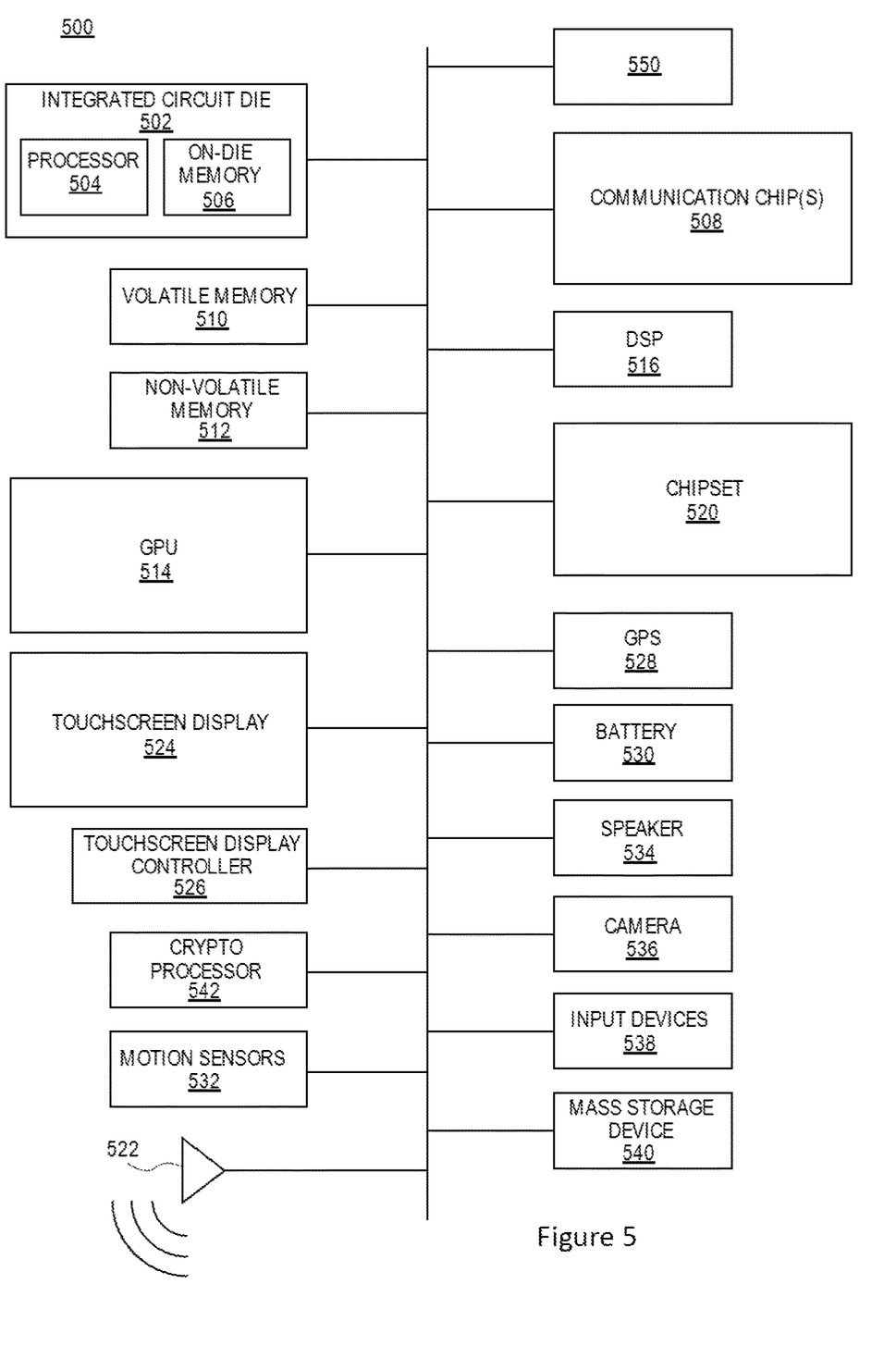
FIG. 5 schematically illustrates a computing device built in accordance with an embodiment of the disclosure, in accordance with some embodiments.

FIG. 5 illustrates a computing device 500 in accordance with one embodiment of the disclosure. The computing device 500 may include a number of components. In one embodiment, these components are attached to one or more motherboards. In an alternate embodiment, some or all of these components are fabricated onto a single system-on-a-chip (SoC) die, such as a SoC used for mobile devices. The components in the computing device 500 include, but are not limited to, an integrated circuit die 502 and at least one communications logic unit 508. In some implementations the communications logic unit 508 is fabricated within the integrated circuit die 502 while in other implementations the communications logic unit 508 is fabricated in a separate integrated circuit chip that may be bonded to a substrate or motherboard that is shared with or electronically coupled to the integrated circuit die 502. The integrated circuit die 502 may include a processor 504 as well as on-die memory 506, often used as cache memory, which can be provided by technologies such as embedded DRAM (eDRAM), or SRAM. For example, the on-die memory 506 may include multiple memory cells, where the memory cells may include a capacitor similar to the capacitors 110, 120, 160, or 420 as shown in FIGS. 1-4. The computing device 500 may also include a capacitor or a capacitor array 550 that is coupled to the processor integrated circuit die 502, where the capacitor or the capacitor array 550 may be similar to the capacitors 110, 120, 160, 420, or the capacitor array 320, 360, as shown in FIGS. 1-4.

In embodiments, the computing device 500 may include a display or a touchscreen display 524, and a touchscreen display controller 526. A display or the touchscreen display 524 may include a FPD, an AMOLED display, a TFT LCD, a micro light-emitting diode (μLED) display, or others.

Computing device 500 may include other components that may or may not be physically and electrically coupled to the motherboard or fabricated within a SoC die. These other components include, but are not limited to, volatile memory 510 (e.g., dynamic random access memory (DRAM), non-volatile memory 512 (e.g., ROM or flash memory), a graphics processing unit 514 (GPU), a digital signal processor (DSP) 516, a crypto processor 542 (e.g., a specialized processor that executes cryptographic algorithms within hardware), a chipset 520, at least one antenna 522 (in some implementations two or more antenna may be used), a battery 530 or other power source, a power amplifier (not shown), a voltage regulator (not shown), a global positioning system (GPS) device 528, a compass, a motion coprocessor or sensors 532 (that may include an accelerometer, a gyroscope, and a compass), a microphone (not shown), a speaker 534, a camera 536, user input devices 538 (such as a keyboard, mouse, stylus, and touchpad), and a mass storage device 540 (such as hard disk drive, compact disk (CD), digital versatile disk (DVD), and so forth). The computing device 500 may incorporate further transmission, telecommunication, or radio functionality not already described herein. In some implementations, the computing device 500 includes a radio that is used to communicate over a distance by modulating and radiating electromagnetic waves in air or space. In further implementations, the computing device 500 includes a transmitter and a receiver (or a transceiver) that is used to communicate over a distance by modulating and radiating electromagnetic waves in air or space.

The communications logic unit 508 enables wireless communications for the transfer of data to and from the computing device 500. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communications logic unit 508 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Infrared (IR), Near Field Communication (NFC), Bluetooth, derivatives thereof, as well as any other wireless protocols that are designated as 3G, 4G, 5G, and beyond. The computing device 500 may include a plurality of communications logic units 508. For instance, a first communications logic unit 508 may be dedicated to shorter range wireless communications such as Wi-Fi, NFC, and Bluetooth and a second communications logic unit 508 may be dedicated to longer range wireless communications such as GPS, EDGE, GPRS, CDMA, WiMAX, LTE, Ev-DO, and others.

The processor 504 of the computing device 500 includes one or more devices, such as transistors. The term "processor" may refer to any device or portion of a device that processes electronic data from registers and/or memory to transform that electronic data into other electronic data that may be stored in registers and/or memory. The communications logic unit 508 may also include one or more devices, such as transistors.

In further embodiments, another component housed within the computing device 500 may contain one or more devices, such as DRAM, that are formed in accordance with implementations of the current disclosure.

In various embodiments, the computing device 500 may be a laptop computer, a netbook computer, a notebook computer, an ultrabook computer, a smartphone, a dumbphone, a tablet, a tablet/laptop hybrid, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 500 may be any other electronic device that processes data.

Some Non-Limiting Examples are Provided Below.

Example 1 may include a semiconductor device, comprising: a three dimensional capacitor including: a pole; and one or more capacitor units stacked around the pole, wherein a capacitor unit of the one or more capacitor units includes: a first electrode surrounding and coupled to the pole, a dielectric layer surrounding the first electrode, and a second electrode surrounding the dielectric layer.

Example 2 may include the semiconductor device of example 1 and/or some other examples herein, further comprising: a transistor, wherein the transistor includes a channel along a first direction, and wherein the pole is placed in a second direction orthogonal to the first direction.

Example 3 may include the semiconductor device of example 1 and/or some other examples herein, wherein the capacitor unit is a first capacitor unit, and the capacitor further includes a second capacitor unit, and wherein a dielectric layer of the first capacitor unit and a dielectric layer of the second capacitor unit form a continuous dielectric layer conformally surrounding the pole and the first electrodes of the first capacitor unit and the second capacitor unit, and the second electrode of the first capacitor and the second electrode of the second capacitor form a continuous electrode.

Example 4 may include the semiconductor device of example 1 and/or some other examples herein, wherein the capacitor unit is a first capacitor unit, and the capacitor further includes a second capacitor unit, and wherein a first electrode of the first capacitor unit contains a material different from a first electrode of the second capacitor unit, or a dielectric layer of the first capacitor unit contains a material different from a dielectric layer of the second capacitor unit.

Example 5 may include the semiconductor device of example 1 and/or some other examples herein, wherein the capacitor includes a first capacitor unit with a first electrode having a first circumference in a top down view and a first area, and a second capacitor unit with a first electrode having a second circumference in a top down view and a second area, and wherein the first circumference is different from the second circumference, or the first area is different from the second area.

Example 6 may include the semiconductor device of example 1 and/or some other examples herein, wherein the first electrode, the dielectric layer, or the second electrode encloses an area of a square shape, a rectangular shape, a circle, an ellipse shape, or a polygon comprising three or more sides.

Example 7 may include the semiconductor device of example 1 and/or some other examples herein, wherein the first electrode includes a first metallic material with a first work function, and the second electrode includes a second metallic material with a second work function different from the first work function.

Example 8 may include the semiconductor device of example 1 and/or some other examples herein, wherein the first electrode or the second electrode includes W, Mo, Ti, Ta, Al, TaN, TiN, TiC, WN, MoN, MoC, Co, Ni, Cu, Ru, Pd, Pt, Ir, IrOx, graphene, $MnO_2$, Li, RuOx, ITO, SrRuOx, a metal oxide, graphitic carbon, an alkali metal, a low-work-function metal, a transition metal oxide, a Co oxide, $LiCoO_2$, $NaCoO_2$, a transition metal dichalcogenide, a spinel oxide, $LiMn_2O_4$, $LiNiMnO_4$, a conducting polymer, or a conductive metal.

Example 9 may include the semiconductor device of example 1 and/or some other examples herein, wherein the dielectric layer includes $Al_2O_3$, $HfO_2$, $ZrO_2$, $TiO_2$, $Nb_2O_5$, $Ta_2O_5$, SrTiOx, BaTiOx, $Ga_2O_3$, $Y_2O_3$, a rare earth oxide, a solid-state electrolyte, a glass electrolyte, a ceramic electrolyte, an ionically-conducting antiperovskite, $Li_3ClO$, a doped $Li_{(3-2x)}D_xClO$ where D is a divalent cation dopant, hafnium silicate, zirconium silicate, hafnium dioxide, hafnium zirconate, zirconium dioxide, aluminum oxide, titanium oxide, silicon nitride, carbon doped silicon nitride, silicon carbide, and nitride hafnium silicate, a high-k dielectric material, or an alloy thereof.

Example 10 may include the semiconductor device of example 9 and/or some other examples herein, wherein the solid state electrolyte layer includes oxide, or a chalcogenide based layer.

Example 11 may include the semiconductor device of example 1 and/or some other examples herein, wherein the capacitor unit further includes an interface layer between the first electrode and the dielectric layer, or between the dielectric layer and the second electrode.

Example 12 may include the semiconductor device of example 11 and/or some other examples herein, wherein the interface layer includes a pseudocapacitive layer, and wherein the pseudocapacitive layer includes $RuO_x$, $MnO_x$, $VO_x$, an active redox center material, or a catalytic relay material.

Example 13 may include the semiconductor device of example 1 and/or some other examples herein, wherein the first electrode or the second electrode is coupled to a power rail.

Example 14 may include the semiconductor device of example 1 and/or some other examples herein, wherein the three dimensional capacitor is a supercapacitor, an electrostatic double-layer capacitor (EDLC), an electrochemical capacitor, a pseudocapacitor, a redox faradaic reaction based pseudocapacitor, a lithium-ion capacitor, an electrochemical energy storage device, or a hybrid battery-supercapacitor device.

Example 15 may include the semiconductor device of example 1 and/or some other examples herein, wherein the capacitor is located at an interposer coupled to a processor, or at backside of a processor.

Example 16 may include the semiconductor device of example 1 and/or some other examples herein, wherein the three dimensional capacitor has a dielectric breakdown voltage of greater than about 1V and less than about 5V.

Example 17 may include a method for forming a semiconductor device, the method comprising: forming a transistor, wherein the transistor includes a channel along a first direction; forming a pole placed in a second direction orthogonal to the first direction; forming a first electrode surrounding and coupled to the pole; forming a dielectric layer surrounding the first electrode, and forming a second electrode surrounding the dielectric layer, wherein the first electrode, the dielectric layer, and the second electrode form a capacitor unit around the pole.

Example 18 may include the method of example 17 and/or some other examples herein, wherein the capacitor unit is a first capacitor unit, and the method further comprises: forming a second capacitor unit above the first capacitor unit, wherein forming the second capacitor unit includes: forming a first electrode of the second capacitor unit surrounding and coupled to the pole and above the first capacitor unit; forming a dielectric layer of the second capacitor unit surrounding the first electrode of the second capacitor, and forming a second electrode of the second capacitor unit surrounding the dielectric layer of the second capacitor.

Example 19 may include the method of example 18 and/or some other examples herein, wherein the dielectric layer of the first capacitor unit and the dielectric layer of the second capacitor unit form a continuous dielectric layer conformally surrounding the pole and the first electrodes of the first capacitor unit and the second capacitor unit, and the second electrode of the first capacitor and the second electrode of the second capacitor form a continuous electrode.

Example 20 may include the method of example 17 and/or some other examples herein, further comprising:

forming an interface layer between the first electrode and the dielectric layer, or between the dielectric layer and the second electrode.

Example 21 may include a computing device, comprising: a transistor including a channel along a first direction located in a semiconductor device; and a three dimensional capacitor coupled to the transistor, wherein the three dimensional capacitor includes a pole, and one or more capacitor units stacked around the pole placed in a second direction orthogonal to the first direction, wherein a capacitor unit of the one or more capacitor units includes: a first electrode surrounding and coupled to the pole, a dielectric layer surrounding the first electrode, and a second electrode surrounding the dielectric layer.

Example 22 may include the computing device of example 21 and/or some other examples herein, wherein the transistor is a part of a processor.

Example 23 may include the computing device of example 21 and/or some other examples herein, wherein the three dimensional capacitor is coupled to the transistor through a power rail located at back end of line for the semiconductor device.

Example 24 may include the computing device of example 21 and/or some other examples herein, wherein the three dimensional capacitor is located in an interposer.

Example 25 may include the computing device of example 21 and/or some other examples herein, wherein the computing device is a wearable device or a mobile computing device, the wearable device or the mobile computing device including one or more of an antenna, a touchscreen controller, a display, a battery, a processor, an audio codec, a video codec, a power amplifier, a global positioning system (GPS) device, a compass, a Geiger counter, an accelerometer, a gyroscope, a speaker, or a camera coupled with the memory device.

Various embodiments may include any suitable combination of the above-described embodiments including alternative (or) embodiments of embodiments that are described in conjunctive form (and) above (e.g., the "and" may be "and/or"). Furthermore, some embodiments may include one or more articles of manufacture (e.g., non-transitory computer-readable media) having instructions, stored thereon, that when executed result in actions of any of the above-described embodiments. Moreover, some embodiments may include apparatuses or systems having any suitable means for carrying out the various operations of the above-described embodiments.

The above description of illustrated implementations, including what is described in the Abstract, is not intended to be exhaustive or to limit the embodiments of the present disclosure to the precise forms disclosed. While specific implementations and examples are described herein for illustrative purposes, various equivalent modifications are possible within the scope of the present disclosure, as those skilled in the relevant art will recognize.

These modifications may be made to embodiments of the present disclosure in light of the above detailed description. The terms used in the following claims should not be construed to limit various embodiments of the present disclosure to the specific implementations disclosed in the specification and the claims. Rather, the scope is to be determined entirely by the following claims, which are to be construed in accordance with established doctrines of claim interpretation.

What is claimed is:

1. An integrated circuit structure, comprising:
   a pole;
   a first disc electrode surrounding and in contact with a first portion of the pole;
   a second disc electrode surrounding and in contact with a second portion of the pole, the second disc electrode over and spaced apart from the first disc electrode;
   a dielectric layer surrounding and continuous between the first disc electrode and the second disc electrode, the dielectric layer along the pole between the first disc electrode and the second disc electrode; and
   an electrode layer surrounding the dielectric layer, the electrode layer along the pole between the first disc electrode and the second disc electrode.

2. The integrated circuit structure of claim 1, further comprising:
   a third disc electrode surrounding and in contact with a third portion of the pole, the third disc electrode over and spaced apart from the second disc electrode, wherein the dielectric layer is further surrounding the third disc electrode and is continuous between the third disc electrode and the second disc electrode, the dielectric layer along the pole between the third disc electrode and the second disc electrode, and wherein the electrode layer is further along the pole between the third disc electrode and the second disc electrode.

3. The integrated circuit structure of claim 1, further comprising:
   a transistor, wherein the transistor includes a channel along a first direction, and wherein the pole is along a second direction orthogonal to the first direction.

4. The integrated circuit structure of claim 1, wherein the first disc electrode and the second disc electrode have a same circumference.

5. The integrated circuit structure of claim 1, wherein the first disc electrode has a circumference different than a circumference of the second disc electrode.

6. The integrated circuit structure of claim 1, wherein the first and second disc electrodes includes a first metallic material with a first work function, and the electrode layer includes a second metallic material with a second work function different from the first work function.

7. The integrated circuit structure of claim 1, wherein the first and second disc electrodes comprise W, Mo, Ti, Ta, Al, TaN, TiN, TiC, WN, MoN, MoC, Co, Ni, Cu, Ru, Pd, Pt, Ir, IrOx, graphene, $MnO_2$, Li, RuOx, ITO, SrRuOx, a metal oxide, graphitic carbon, an alkali metal, a low-work-function metal, a transition metal oxide, a Co oxide, $LiCoO_2$, $NaCoO_2$, a transition metal dichalcogenide, a spinel oxide, $LiMn_2O_4$, $LiNiMnO_4$, a conducting polymer, or a conductive metal.

8. The integrated circuit structure of claim 1, wherein the dielectric layer comprises $Al_2O_3$, $HfO_2$, $ZrO_2$, $TiO_2$, $Nb_2O_5$, $Ta_2O_5$, SrTiOx, BaTiOx, $Ga_2O_3$, $Y_2O_3$, a rare earth oxide, a solid-state electrolyte, a glass electrolyte, a ceramic electrolyte, an ionically-conducting antiperovskite, $Li_3ClO$, a doped $Li_{(3-2x)}D_xClO$ where D is a divalent cation dopant, hafnium silicate, zirconium silicate, hafnium dioxide, hafnium zirconate, zirconium dioxide, aluminum oxide, titanium oxide, silicon nitride, carbon doped silicon nitride, silicon carbide, and nitride hafnium silicate, a high-k dielectric material, or an alloy thereof.

9. The integrated circuit structure of claim 8, wherein the solid state electrolyte layer includes oxide, or a chalcogenide based layer.

10. The integrated circuit structure of claim 1, further comprising:
    an interface layer between the dielectric layer and the first and second disc electrodes.

11. The integrated circuit structure of claim 1, further comprising:
an interface layer between the dielectric layer and the electrode layer.

12. The integrated circuit structure of claim 1, further comprising:
a first interface layer between the dielectric layer and the first and second disc electrodes; and
a second interface layer between the dielectric layer and the electrode layer.

13. The integrated circuit structure of claim 1, wherein the first and second disc electrodes are coupled to a power rail.

14. The integrated circuit structure of claim 1, wherein the electrode layer is coupled to a power rail.

15. A computing device, comprising:
a board; and
a component coupled to the board, the component including an integrated circuit structure, the integrated circuit structure comprising:
a pole;
a first disc electrode surrounding and in contact with a first portion of the pole;
a second disc electrode surrounding and in contact with a second portion of the pole, the second disc electrode over and spaced apart from the first disc electrode;
a dielectric layer surrounding and continuous between the first disc electrode and the second disc electrode, the dielectric layer along the pole between the first disc electrode and the second disc electrode; and
an electrode layer surrounding the dielectric layer, the electrode layer along the pole between the first disc electrode and the second disc electrode.

16. The computing device of claim 15, further comprising:
a memory coupled to the board.

17. The computing device of claim 15, further comprising:
a communication chip coupled to the board.

18. The computing device of claim 15, further comprising:
a battery coupled to the board.

19. The computing device of claim 15, further comprising:
a camera coupled to the board.

20. The computing device of claim 15, wherein the component is a packaged integrated circuit die.

* * * * *